United States Patent
Lee et al.

(10) Patent No.: US 6,353,254 B1
(45) Date of Patent: Mar. 5, 2002

(54) DEVICE ISOLATION STRUCTURE AND DEVICE ISOLATION METHOD FOR A SEMICONDUCTOR POWER INTEGRATED CIRCUIT

(75) Inventors: Chang-Jae Lee; Jae-Il Ju, both of Cheongju (KR)

(73) Assignee: Hyundai Electronics Ind. Co. Ltd., Kyoungki-do (KR)

(*) Notice: Subject to any disclaimer, the term of this patent is extended or adjusted under 35 U.S.C. 154(b) by 0 days.

(21) Appl. No.: 09/717,304

(22) Filed: Nov. 22, 2000

Related U.S. Application Data (62) Division of application No. 09/233,463, filed on Jan. 20, 1999, now Pat. No. 6,171,930.

(30) Foreign Application Priority Data

Jan. 20, 1998 (KR) .............................................. 98-1543

(51) Int. Cl.⁷ .............................................. H01L 29/00
(52) U.S. Cl. ...................... 257/510; 257/500; 257/506; 257/520; 257/524
(58) Field of Search ................................ 257/500, 501, 257/506, 507, 510, 513, 520, 524

(56) References Cited

U.S. PATENT DOCUMENTS

| | | | |
|---|---|---|---|
| 5,066,609 A | | 11/1991 | Yamamoto et al. |
| 5,116,779 A | | 5/1992 | Iguchi |
| 5,306,940 A | * | 4/1994 | Yamazaki .................. 257/374 |
| 5,561,073 A | | 10/1996 | Jerome et al. |
| 5,605,852 A | | 2/1997 | Bencuya |
| 5,616,512 A | | 4/1997 | Ronsisvalle |
| 5,679,599 A | * | 10/1997 | Mehta ......................... 437/69 |
| 5,683,932 A | | 11/1997 | Bashir et al. |
| 6,064,104 A | * | 5/2000 | Omid-Zohoor et al. ..... 257/510 |

FOREIGN PATENT DOCUMENTS

JP   08130241 A   *   5/1996

* cited by examiner

Primary Examiner—Nathan Flynn
Assistant Examiner—Remmon R. Fordé
(74) Attorney, Agent, or Firm—Birch, Stewart, Kolasch & Birch, LLP

(57) ABSTRACT

The present invention relates to a device isolation structure and a device isolation method in a semiconductor power IC. The device isolation structure according to the present invention includes: a semiconductor substrate including a high voltage region and a low voltage region; a trench overlapping the high voltage device region of the semiconductor substrate and an interfacing region formed between the high voltage device region and the low voltage device region; a fourth insulating film, a fifth insulating film, and a conductive film sequentially layered in the trench; a first insulating film pattern formed on the semiconductor substrate including the trench; and field insulating films respectively formed on the trench and on a portion of an upper surface of the semiconductor substrate which is exposed out of the first insulating film pattern. The present invention has several advantages concerning manufacturing costs and reliability, some of which being achieved by forming a thermal oxide film in an empty space of the conductive film by which oxygen is permeated thereinto and thus restraining breakdown from being generated between high voltage devices at a high voltage.

13 Claims, 11 Drawing Sheets

DEVICE ISOLATION STRUCTURE AND DEVICE ISOLATION METHOD FOR A SEMICONDUCTOR POWER INTEGRATED CIRCUIT

This application is a divisional of co-pending application Ser. No. 09/233,463, now U.S. Pat. No. 6,171,930 filed on Jan. 20, 1999, the entire contents of which are hereby incorporated by reference.

BACKGROUND OF THE INVENTION

1. Field of the Invention

The present invention relates to a semiconductor device, and more particularly to a device isolation structure and a device isolation method in a semiconductor power integrated circuit (IC) capable of isolating a common region between a high voltage device region and a low voltage device region using a field insulating film according to a local oxidation of silicon (LOCOS), applying a silicon on insulator (SOI).

2. Discussion of the Background

As semiconductor devices have become highly integrated and fabricating techniques thereof have been developed, attempts to achieve a single-chip system have been made. According to the single-chip system, a single chip is constructed with a controller, a memory, and a circuit operated at a low voltage. In order to achieve the single-chip system that is light in weight and compact in size, the system should integrate a circuit unit controlling a power source of the system, which includes an input terminal, an output terminal, and a main circuit as a single chip. Each of the input and output terminals, to which a high voltage (HV) is applied, is constructed as a HV power transistor since a low voltage (LV) CMOS circuit can not be applied thereto.

Accordingly, to reduce its weight and size, the input and output terminals of the power source and the controller must be integrated as a single chip. To accomplish the above object, IC techniques have been developed for constructing the HV transistor (hereinafter, called HV TR) and the LV CMOS circuit as a single chip.

According to the prior art, a wafer having a thick epi-layer having a deep junction depth is used to achieve HV breakdown. However, a process of forming a wafer having such a deep junction depth requires a lengthy diffusion time on the order of thousands of minutes. In addition, a device between a HV TR and another TR must be isolated by a junction isolation or a self-isolation method, thus lowering throughput and enlarging chip size. Further, it is difficult to integrate the process of forming the deep junction depth with a general CMOS process. Therefore, a power IC technique involving the application of a SOI substrate has been introduced to overcome the disadvantages of the IC technique.

According to the SOI power IC technique, the deep junction depth is not required. In addition, a chip size can be reduced by isolating devices according to a trench isolation method in the SOI power IC technique to improve the throughput of the resulting structure. Above all, the SOI power IC technique can easily be integrated with the general CMOS technique.

In the power IC technique using the SOI substrate, a HV device region is isolated by the trench method, and a LV CMOS region is isolated by a LOCOS method. The main processes involved in the power IC technique are a device isolation method for continuously connecting the two regions and a method for forming a field.

According to the conventional method, the HV device region is isolated by a trench, the LV CMOS region is isolated by a LOCOS, and an interfacing region therebetween is embodied as a field oxide film applying a CVD oxide film ($SiO_2$).

Hereinafter, a device isolation structure and a device isolation method in the conventional semiconductor power IC will be described with reference to the accompanying drawings.

Figure 1:
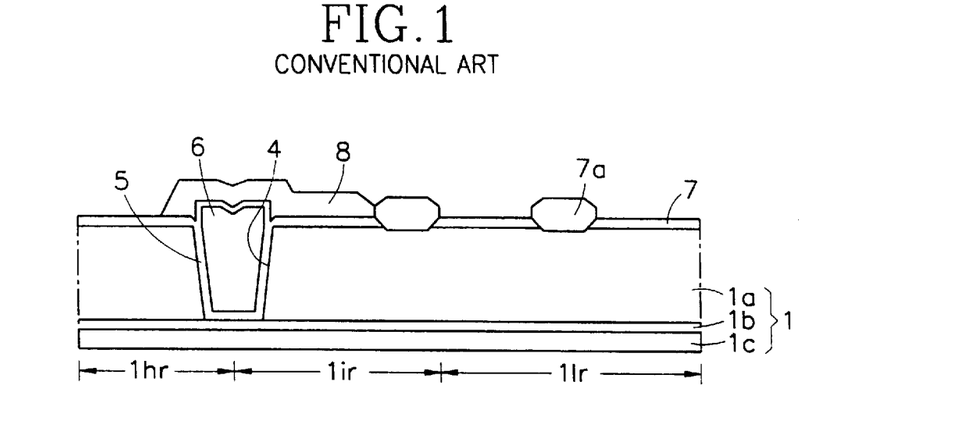
FIG. 1 is a vertical cross-sectional diagram of a device isolation structure of a conventional semiconductor power IC.

FIG. 1 is a vertical cross-sectional diagram of a device isolation structure of the conventional semiconductor power IC. As shown therein, the conventional device isolation structure includes: a semiconductor SOI substrate 1 which includes a HV device region 1$hr$ in which a HV TR is to be formed, and a LV device region 1$lr$ in which a LV CMOS circuit is to be formed; a trench 4 overlapping the HV device region 1$hr$ and an interfacing region 1$ir$ that is positioned between the HV device region 1$hr$ and the LV device region 1$lr$; a polysilicon film 6 filled in the trench 4; a second $SiO_2$ film 7 formed on a resultant upper surface of the semiconductor SOI substrate 1; a third high temperature low pressure deposition (HLD) $SiO_2$ film 8 formed on a predetermined portion of an upper surface of the second $SiO_2$ film 7 corresponding to the trench 4; and a field insulating film 7$a$ formed on a portion of the semiconductor SOI substrate 1, which field insulating film 7$a$ extends from a surface of SOI substrate 1 through second $SiO_2$ film 7.

A second HLD $SiO_2$ film 5 is formed between the trench 4 and the polysilicon film 6, and the field insulating film 7$a$ is formed at the interfacing region 1$ir$ and the LV device region 1$lr$, respectively, and the field insulating film 7$a$ at the interfacing region 1$ir$ is adjacent to the third HLD $SiO_2$ film 8.

Figure 2A:
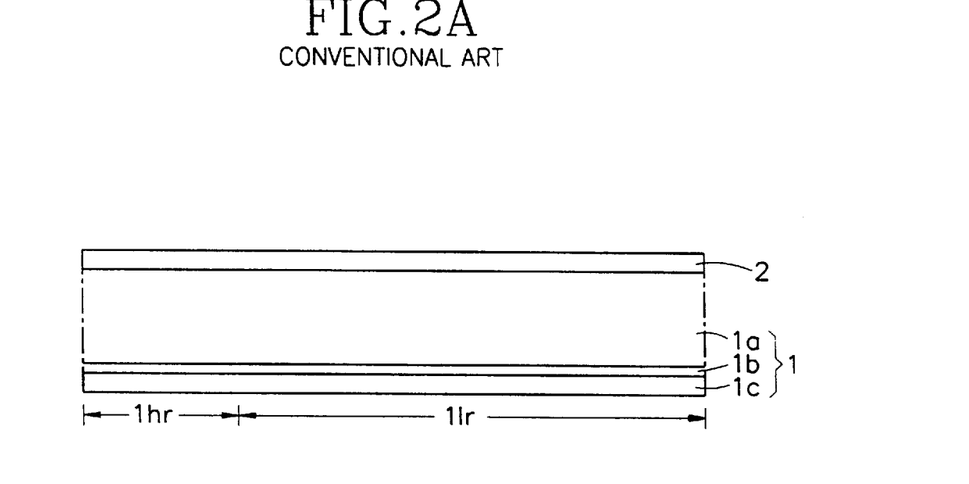
FIGS. 2A–2P are vertical cross-sectional diagrams sequentially illustrating a device isolation method of the conventional semiconductor power IC.
Figure 2B:
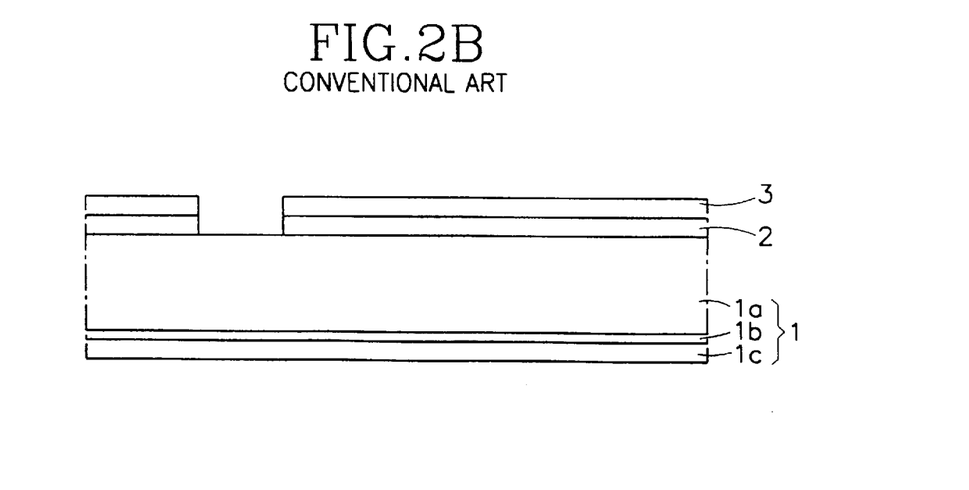
Figure 2C:
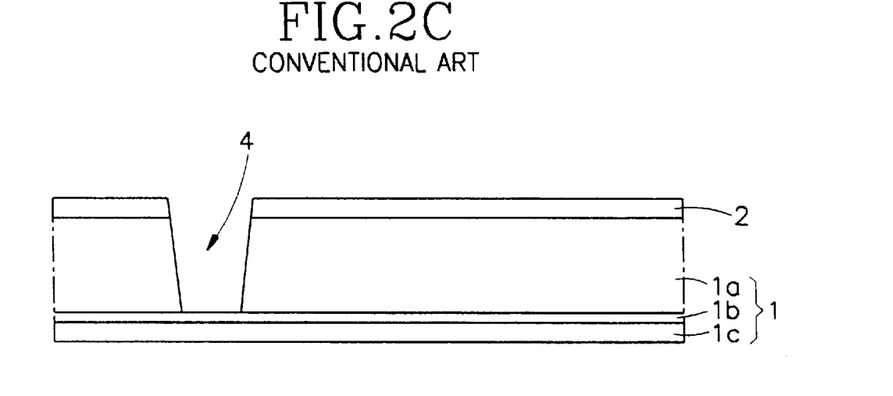
Figure 2D:
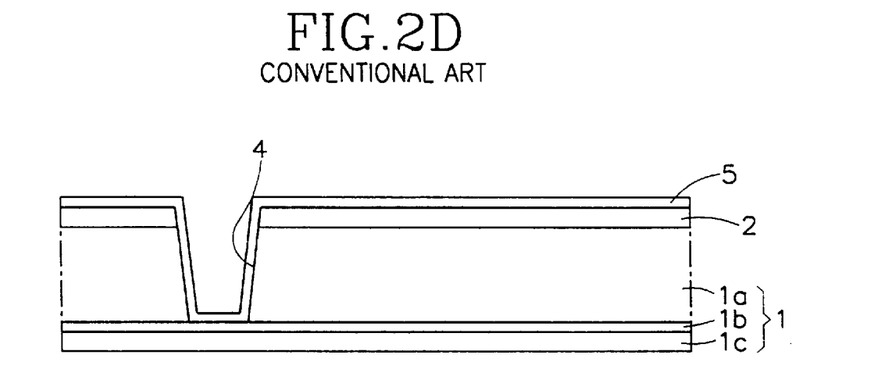
Figure 2E:
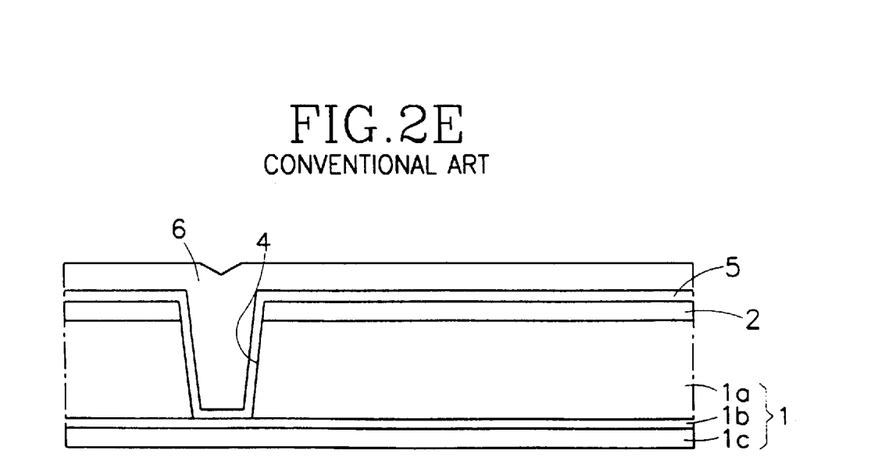
Figure 2F:
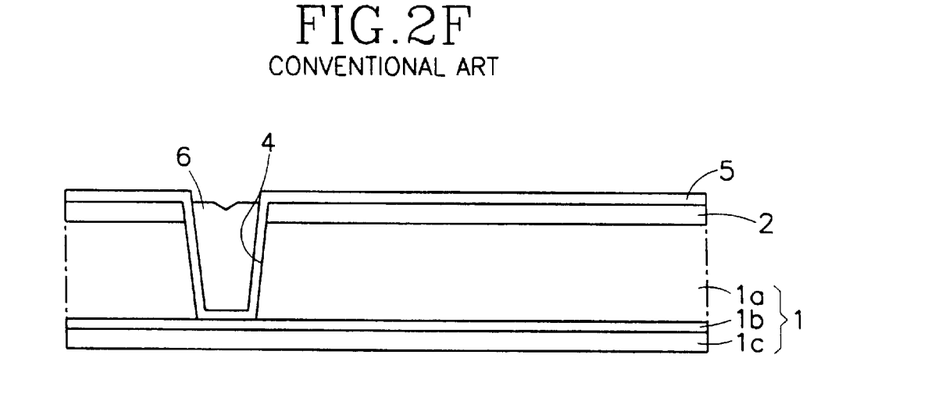
Figure 2G:
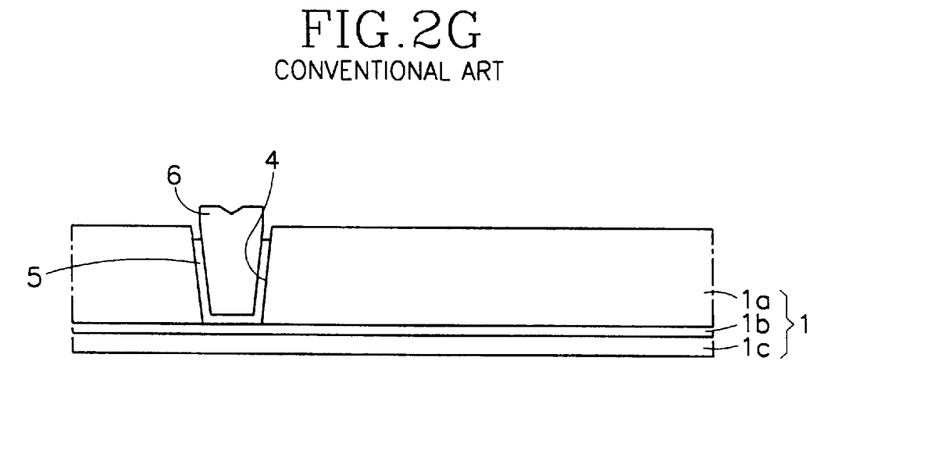
Figure 2H:
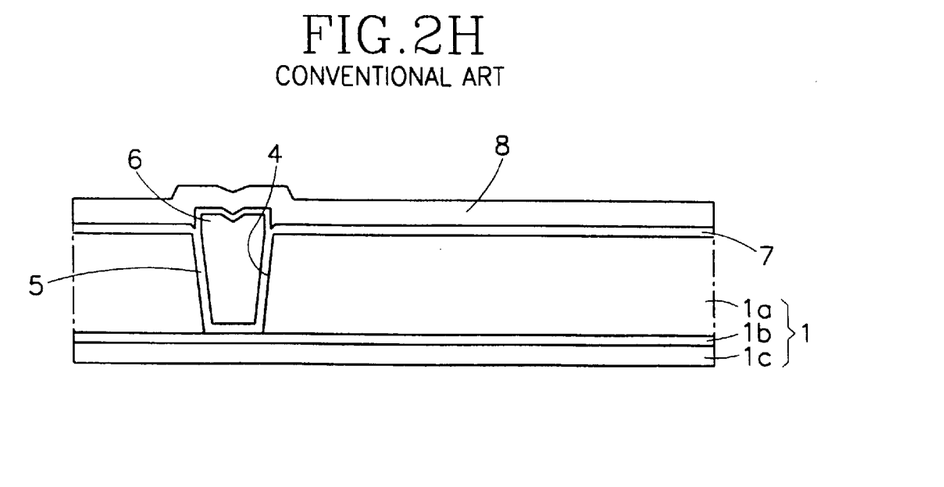
Figure 2I:
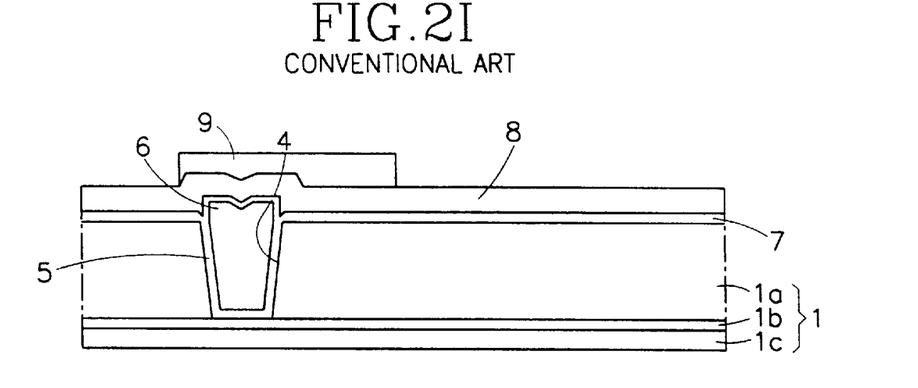
Figure 2J:
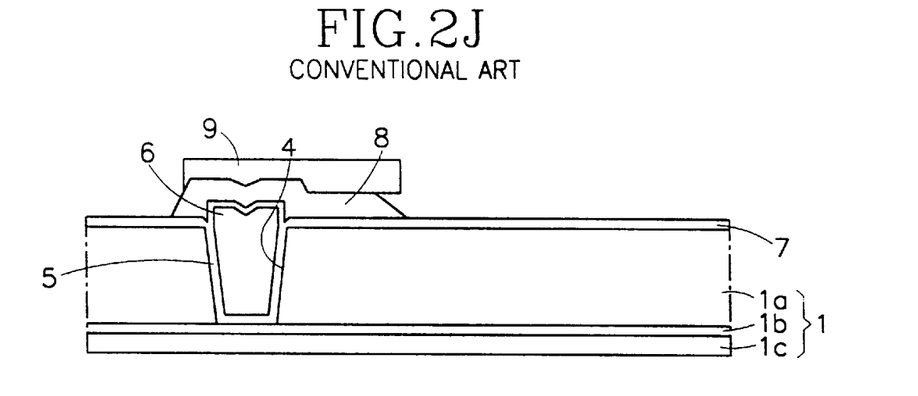
Figure 2K:
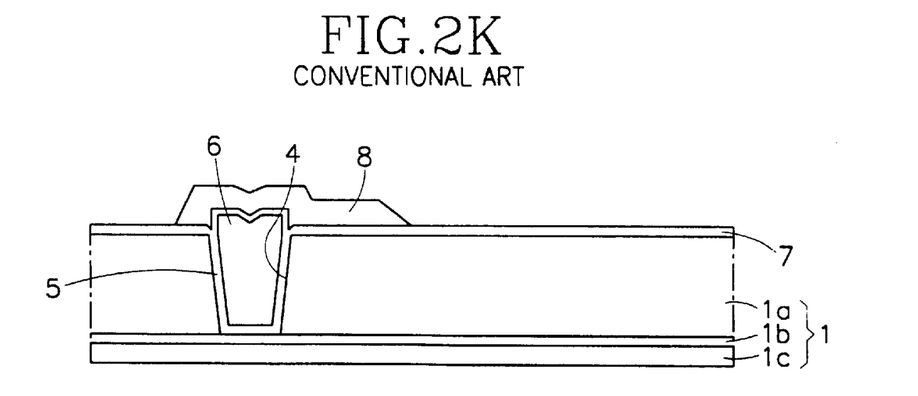
Figure 2L:
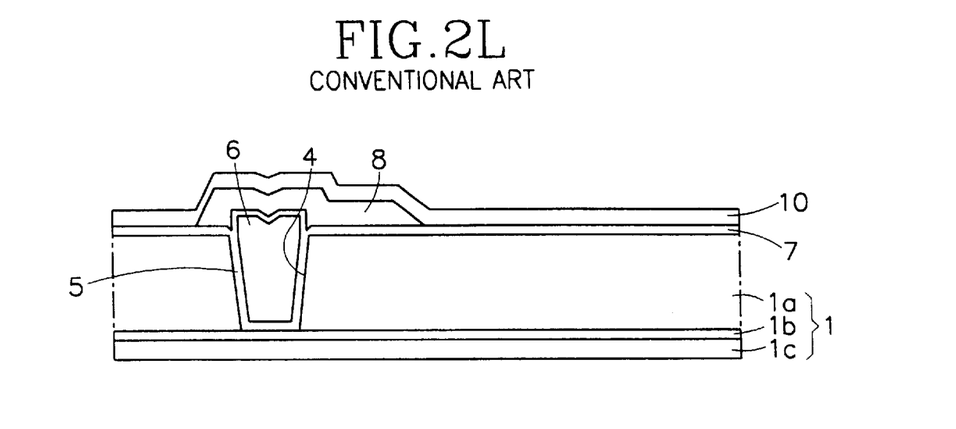
Figure 2M:
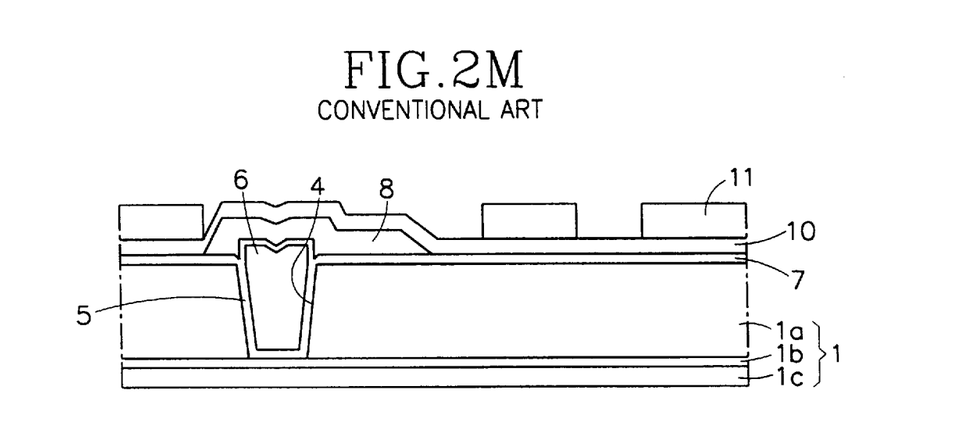
Figure 2N:
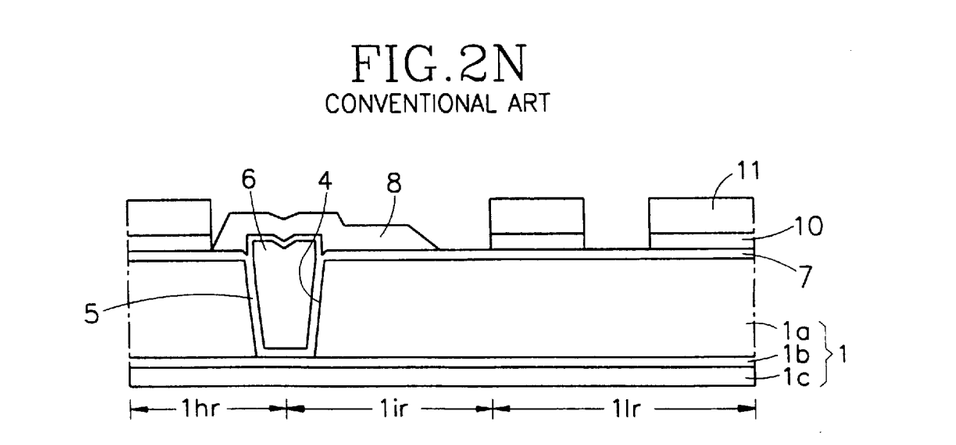
Figure 2O:
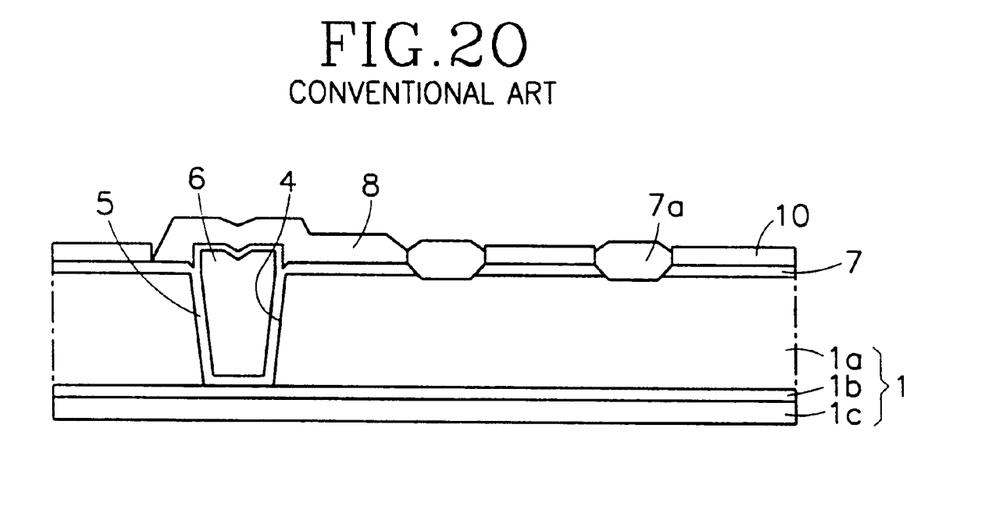
Figure 2P:
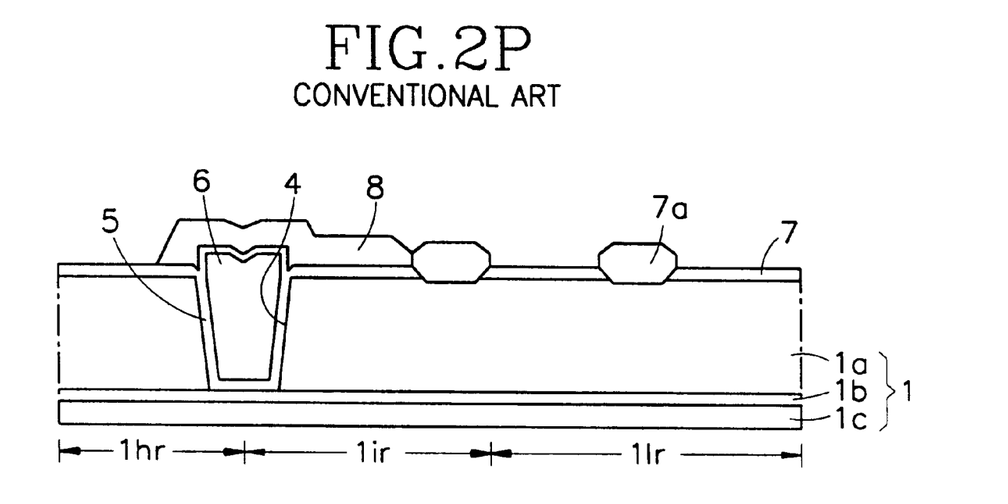

FIGS. 2A–2P sequentially illustrate a device isolation method of the conventional semiconductor power IC.

In FIG. 2A, a first HLD $SiO_2$ film 2 for a hard mask is formed at a thickness of 1000 Å on a semiconductor SOI substrate 1 by high temperature low pressure deposition (HLD). Hereinafter, a silicon oxide film formed by HLD is called a HLD $SiO_2$ film. The SOI substrate 1 is divided into two parts, a HV device region 1$hr$ in which a HV TR is to be formed and a LV device region 1$lr$ in which a LV CMOS is to be formed. An interfacing region may be defined between the HV device region 1$hr$ and the LV device region 1$lr$ in the final step. A general photoresist film is not applied for the hard mask since it has low selectivity with respect to Si etching, rendering it incapable of serving as the mask.

In FIG. 2B, a first photoresist pattern 3 is formed on the first HLD $SiO_2$ film 2, and a predetermined portion of the first HLD $SiO_2$ film 2 is etched by using the first photoresist pattern 3 as a mask. A portion of an upper surface of the SOI substrate 1 corresponding to the etched portion of the first HLD $SiO_2$ film 2 is exposed in this etching process.

In FIG. 2C, the first photoresist pattern 3 is removed, and a trench 4 is formed by which the exposed portion of a silicon layer 1$a$ of the SOI substrate 1 is etched using the remaining portion of first HLD $SiO_2$ film 2 as the hard mask. In this etching process, an insulating layer 1$b$ of the SOI substrate 1 is exposed.

In FIG. 2D, a thin first $SiO_2$ film (not shown) is applied on the first HLD $SiO_2$ film 2 including the trench 4 by a thermal oxidation method, and a second HLD $SiO_2$ film 5 at a thickness of 1400 Å is formed in a conformal manner on a resultant upper surface of the SOI substrate 1 including the trench 4. The first $SiO_2$ film (not shown) is formed at 900° C. under an oxygen/hydrogen atmosphere.

In FIG. 2E, enough polysilicon film 6 is deposited on the second HLD SiO$_2$ film 5 formed on the SOI substrate 1, including the trench 4, to completely fill up the trench 4. The thicknesses of the second HLD Si0$_2$ film 5 and the polysilicon film 6 are determined in accordance with width of the trench 4, so that the trench 4 can be completely filled.

In FIG. 2F, an etch back process is applied to the polysilicon film 6 in order to expose a portion of an upper surface of the second HLD SiO$_2$ film 5 formed on the SOI substrate 1, excluding a portion thereof corresponding to the trench 4.

In FIG. 2G, in order to expose a portion of the upper surface of the SOI substrate 1, excluding the part corresponding to the trench 4, the first HLD SiO$_2$ film 2 and the second HLD SiO$_2$ film 5 are removed by a HF etching solution. A portion of the second HLD SiO$_2$ film 5 that is formed between the trench 4 and the polysilicon film 6 remains after this etching process is performed.

In FIG. 2H, a second SiO$_2$ film 7 having a thickness of 400 A is formed on the SOI substrate 1 and the trench 4 by the thermal oxidation method, and a thin third HLD SiO$_2$ film 8 is formed on the second SiO$_2$ film 7. The third HLD SiO$_2$ film 8 is thinly formed, so that breakdown may not be generated in an interconnection of the HV device region 1hr. The second SiO$_2$ film 7 is formed at 950° C. under the oxygen/hydrogen atmosphere.

In FIG. 2I, a second photoresist pattern 9 is formed on a predetermined portion of the third HLD SiO$_2$ film 8. The second photoresist pattern 9 defines a field insulating film formed by being overlapped with the HV device region 1hr and the interfacing region 1ir.

In FIG. 2J, an exposed portion of the third HLD SiO$_2$ film 8 is removed by etching using the second photoresist pattern 9 as a mask. A portion of an upper surface of the second SiO$_2$ film 7 corresponding the etched third HLD SiO$_2$ film 8 is exposed in the process of FIG. 2J.

Next, the second photoresist pattern 9 is removed as shown in FIG. 2K.

In FIG. 2L, a Si$_3$N$_4$ film 10 is formed on the exposed second SiO$_2$ film 7 and the third HLD SiO$_2$ film 8 by low pressure chemical vapor deposition (LPCVD). Hereinafter, the Si$_3$N$_4$ film 10 formed by LPCVD is called a LPCVD Si$_3$N$_4$ film.

In FIG. 2M, a LOCOS pattern 11 is formed on the LPCVD Si$_3$N$_4$ film 10. The LOCOS pattern 11 is formed of a photoresist film, and defines the trench region 4 of the HV device region 1hr, the interfacing region 1ir between the HV device region 1hr and the LV device region 1lr, and an isolation region of the LV device region 1lr, respectively.

In FIG. 2N, an exposed portion of the LPCVD Si$_3$N$_4$ film 10 is etched and patterned using the LOCOS pattern 11 as a mask. A portion of an upper surface of the second SiO$_2$film 7 corresponding the etched portion of the LPCVD Si$_3$N$_4$ film 10 is exposed.

In FIG. 2O, the LOCOS pattern 11 is removed, and the exposed portion of the second SiO$_2$ film 7 is grown 7000 A via the thermal oxidation method using the LPCVD Si$_3$N$_4$ film 10 and the third HLD SiO$_2$ film 8 as a mask, thus forming each field insulating film 7a at the LV device region 1lr and the interfacing region 1ir. The field insulating film 7a is formed at 950° C. under an oxygen/hydrogen atmosphere.

In FIG. 2P, the device isolation method of the conventional semiconductor power IC is completed by removing the LPCVD Si$_3$N$_4$ film 10.

According to the conventional structure and method, the HLD SiO$_2$ film is used as the field insulating film at the interfacing region of the HV device region and at the LV device region, therefore deposition, masking, and etching processes of the HLD SiO$_2$ film are required, causing the whole process to become complicated.

Also, when depositing an insulating film for a subsequently performed interconnection process, and forming contact holes at the HV device region and the LV device region, an aspect ratio for different contact holes varies significantly other due to the step difference and topology of the insulation film, thus the interconnection process is difficult to accomplish.

SUMMARY OF THE INVENTION

The present invention is directed to a device isolation structure and a device isolation method in a semiconductor power IC that obviates the above and other problems experienced by the related art.

An object of the present invention is to provide a device isolation structure and a device isolation method in a semiconductor power IC, capable of providing an improved isolation process which forms a thermal oxide film in an interfacing region between a HV device region and a LV device region according to a LOCOS method.

Another object of the present invention is to provide a device isolation structure and a device isolation method in a semiconductor power IC which improves properties of a breakdown voltage of the HV device region and the LV device region by filling up a trench with polysilicon, CVD SiO$_2$ film, and thermal oxide film.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a device isolation structure in a semiconductor power IC includes: a semiconductor substrate wherein a high voltage region and a low voltage region are defined; a trench formed by being overlapped with the high voltage device region of the semiconductor substrate and an interfacing region formed between the high voltage device region and the low voltage device region; a fourth insulating film, a fifth insulating film, and a conductive film sequentially filled in the trench; a first insulating film pattern formed on the semiconductor substrate including the trench; and field insulating films respectively formed on the trench and on a portion of an upper surface of the semiconductor substrate which is exposed out of the first insulating film pattern.

Also, to achieve these and other advantages and in accordance with the purpose of the present invention, as embodied and broadly described, a device isolation method in a semiconductor power IC includes the steps of: forming a trench in a semiconductor substrate wherein a high voltage device region and a low voltage device region are defined; filling up the trench with a fourth insulating film, a fifth insulating film, and a conductive film; forming a first insulating film pattern on the semiconductor substrate including the trench; and forming field insulating films respectively on the trench and on a portion of an upper surface of the semiconductor substrate which is exposed out of the first insulating film pattern.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 3:
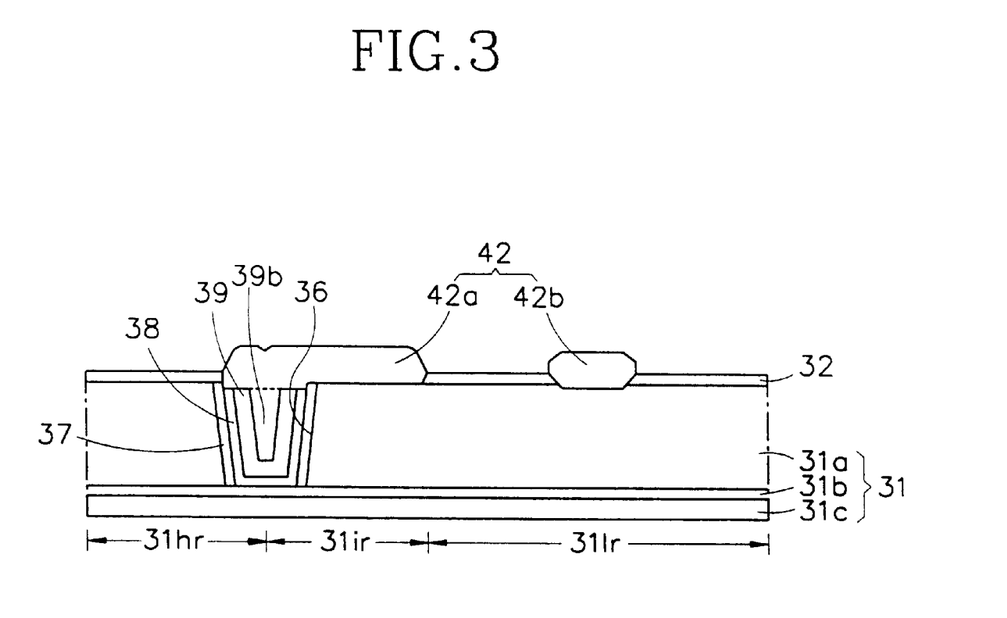
FIG. 3 is a vertical cross-sectional diagram of a device isolation structure in a semiconductor power IC according to the present invention.

FIG. 3 is a vertical cross-sectional diagram of a device isolation structure in a semiconductor power IC according to the present invention.

As shown therein, the device isolation structure according to the present invention includes: a semiconductor SOI substrate 31 which includes a HV device region 31*hr* and a LV device region 31*lr*; a trench 36 overlapping the HV device region 31*hr* of the SOI substrate 31 and an interfacing region 31*ir* that is positioned between the HV device region 31*hr* and the LV device region 31*lr*; a fourth insulating film 37, a fifth insulating film 38 and a conductive film 39 which are sequentially layered in the trench 36; a first insulating film 32 positioned on the SOI substrate 31 including the trench 36; and field insulating films 42*a*, 42*b*, one 42*a* of which being positioned on the trench 36 and on a predetermined portion of an upper surface of the SOI substrate 31 and a second 42*b* of which extending from a surface of SOI substrate 31 through insulating film 32.

An insulating film 39*b* is positioned in the center of the conductive film 39 and connected to the field insulating film 42*a*.

FIGS. 4A–4L are vertical cross-sectional diagrams sequentially illustrating a device isolation method capable of forming a device isolation structure in the semiconductor power IC according to the present invention.

Figure 4A:
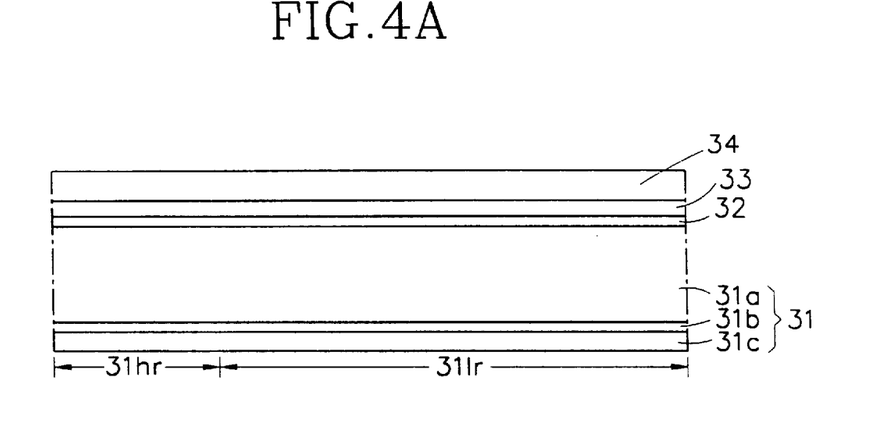
FIGS. 4A–4L are vertical cross-sectional diagrams sequentially illustrating a device isolation method in the semiconductor power IC according to the present invention.

In FIG. 4A, a first insulating film 32 (a $SiO_2$ film) is formed on a semiconductor substrate 31 at 400 A according to a thermal oxidation method. The first insulating film 32 is formed at 950° C. under an oxygen/hydrogen atmosphere. A second insulating film 33 (a LPCVD $Si_3N_4$ film) is formed on the first insulating film 32 at a thickness of 1400 A, and a third insulating film 34 (a HLD $SiO_2$ film) is formed on the second insulating film 33. In the semiconductor substrate 31, a HV device region 31*hr* and a LV device region 31*lr* are defined. An interfacing region may be defined between the HV device region 31*hr* and the LV device region 31*lr* in the final step.

Figure 4B:
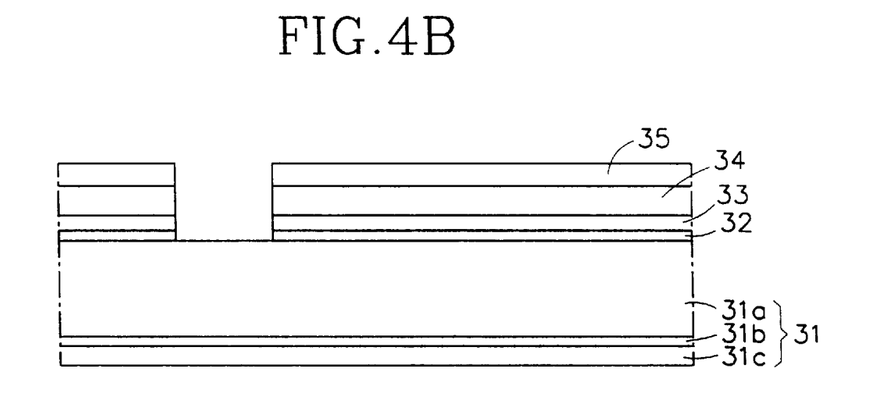

In FIG. 4B, a first photoresist pattern 35 defining a trench region in the SOI substrate 31 of the HV device region 31*hr* is formed on the third insulating film 33. Using first photoresist pattern 35 as a mask, the first, second, and third insulating films 32, 33, 34 are patterned through etching via a reaction ion etching process using $CHF_3/CF_4$ gas. As such, a predetermined portion of the SOI substrate 31 is exposed in a region wherein a trench is to be formed.

Figure 4C:
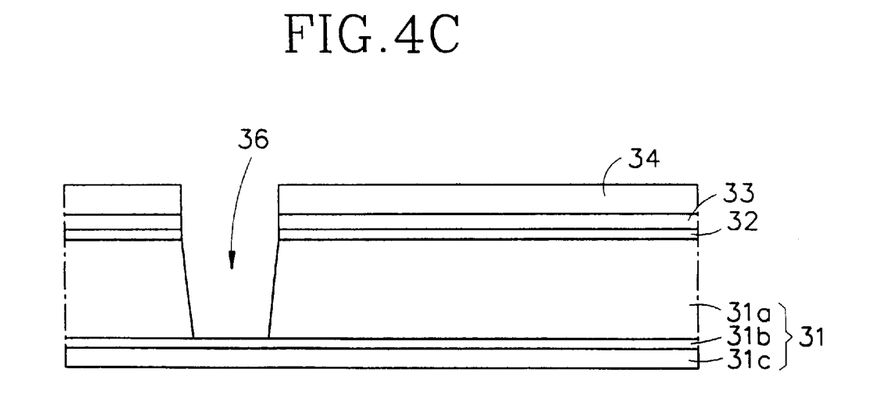

In FIG. 4C, the first photoresist pattern 35 is removed, and the trench 36 is formed by which the exposed surface of a silicon layer 31*a* of the SOI substrate 31 is etched by $SF_6/HBr/Cl_2$ gas according to a mask formed by the patterned first, second, and third insulating films 32, 33, 34. Through this etching process, a portion of an insulating layer 31*b* of SOI substrate 31 is exposed.

Figure 4D:
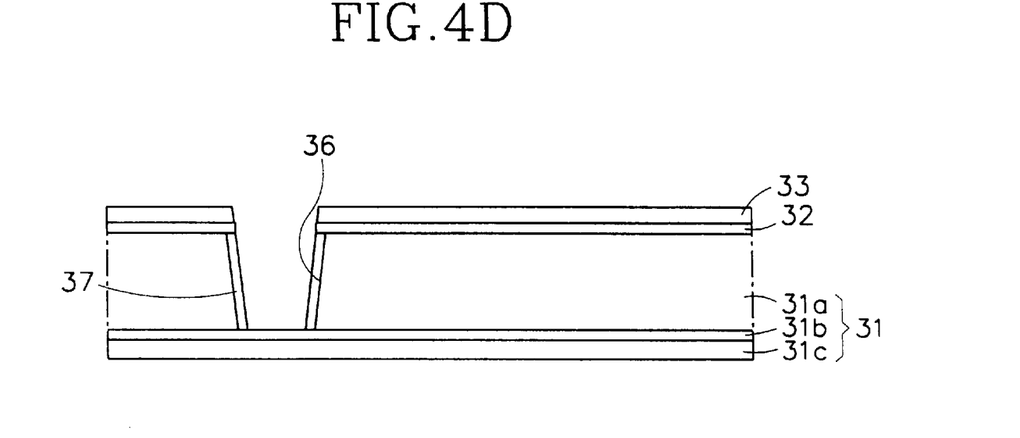

In FIG. 4D, the patterned third insulating film 34 is removed in a buffered HF etching solution which is diluted with water in the ratio of 1:20. Then a fourth insulating film 37 (a $SiO_2$ film) having a thickness of 1000 A is formed against a sidewall of the trench 36 according to the thermal oxidation method. The fourth insulating film 37 is formed at 950° C. under the oxygen/hydrogen atmosphere.

Figure 4E:
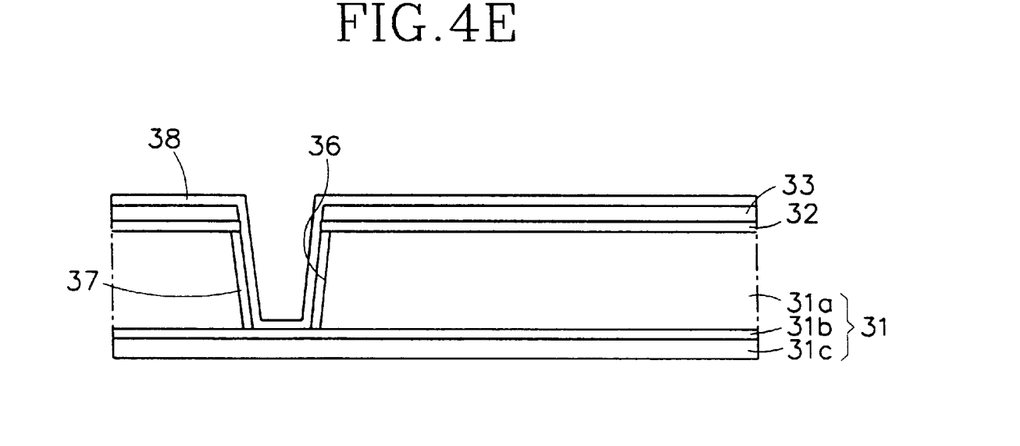

In FIG. 4E, a fifth insulating film 38 (a HLD $SiO_2$ film) of 3000 A is formed 36 in a conformal manner on a resultant surface of the SOI substrate 31 including the trench.

Figure 4F:
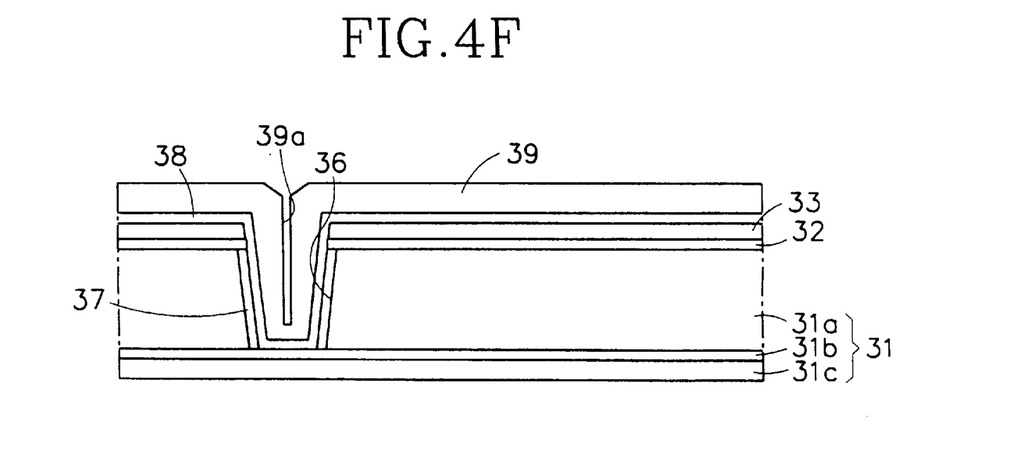

In FIG. 4F, a conductive film 39, a polysilicon film, is formed on an upper surface of the fifth insulating film 38 over the SOI substrate 31 and trench 36 according to LPCVD, thus filling up the trench 36. At this time, an opening in a vertical direction is formed having dimensions that are based on a width of the trench 36, the opening 39*a* creating separation between interfaces of the conductive film 39 filled in the trench. Specifically, an empty space 39*a* is lengthwise formed in the center of the trench 36.

Figure 4G:
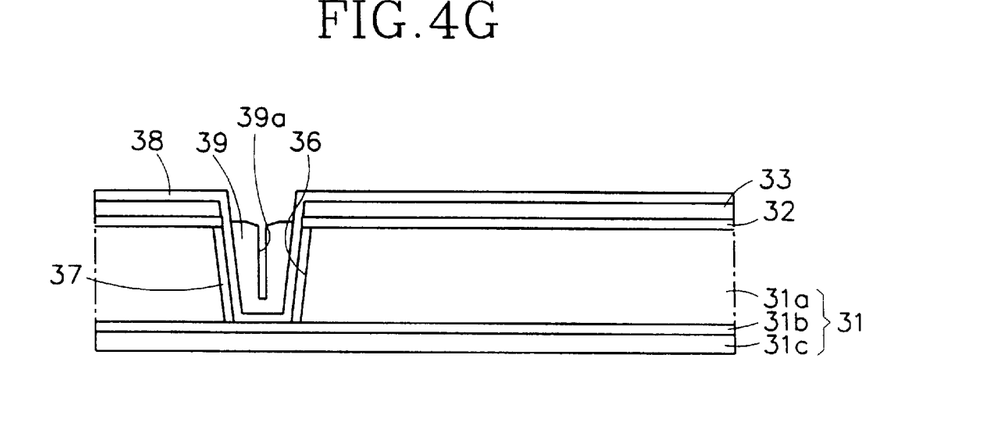

In FIG. 4G, an etch back process is applied to the conductive film 39 in order to expose a portion of an upper surface of the fifth insulating film 38 of the SOI substrate 31, excluding a predetermined portion thereof formed in the trench 36.

Figure 4H:
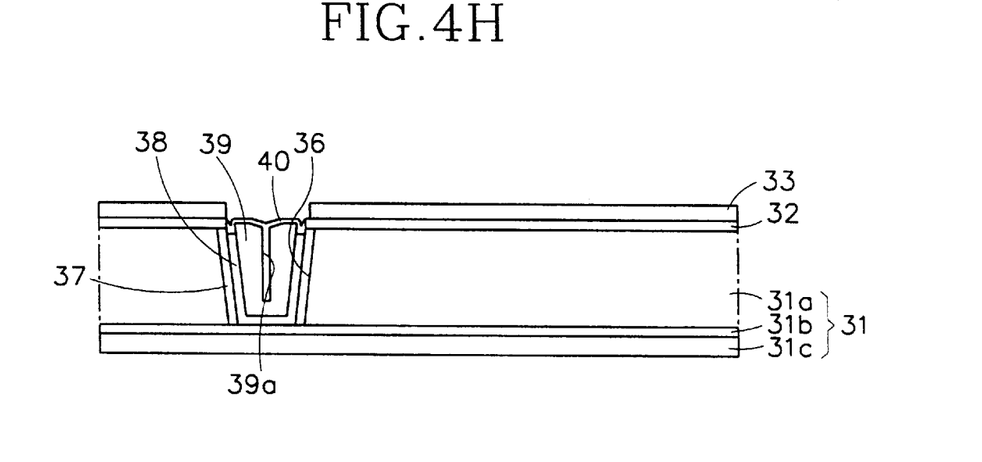

In FIG. 4H, the exposed upper surface of the fifth insulating film 38 is removed in a BOE solution which is diluted with water in the ratio of 1:20, and a sixth insulating film 40 (a $SiO_2$ film) is formed on the trench 36 at a thickness of 1000 A according to the thermal oxidation method. The sixth insulating film 40 is formed at 950° C. under an oxygen/hydrogen atmosphere.

Figure 4I:
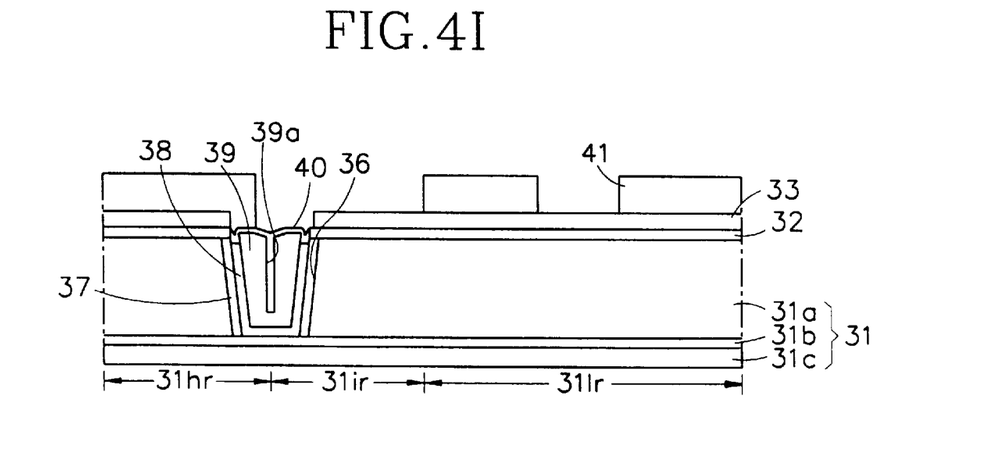

In FIG. 4I, a LOCOS pattern 41, a photoresist pattern, is formed on the second insulating film 33 and the sixth insulating film 40. The LOCOS pattern 41 defines a trench region of the HV device region 31*hr*, an interfacing region 31*ir* positioned between the HV device region 31*hr* and the LV device region 31*lr*, and an isolation region of the LV device region 31*lr*, respectively.

Figure 4J:
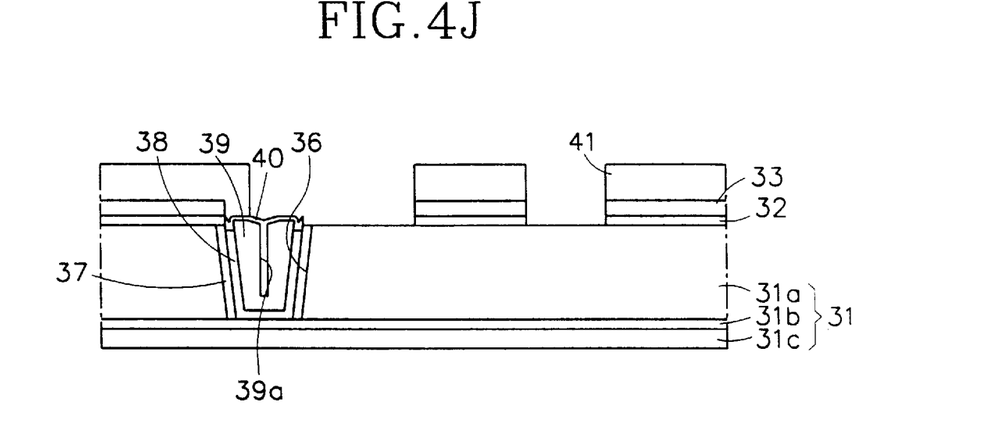

In FIG. 4J, using the LOCOS pattern 41 as a mask, the first and second insulating films 32, 33 are etched and patterned. A portion of an upper surface of the SOI substrate 31 corresponding to the etched portion is exposed in this process.

Figure 4K:
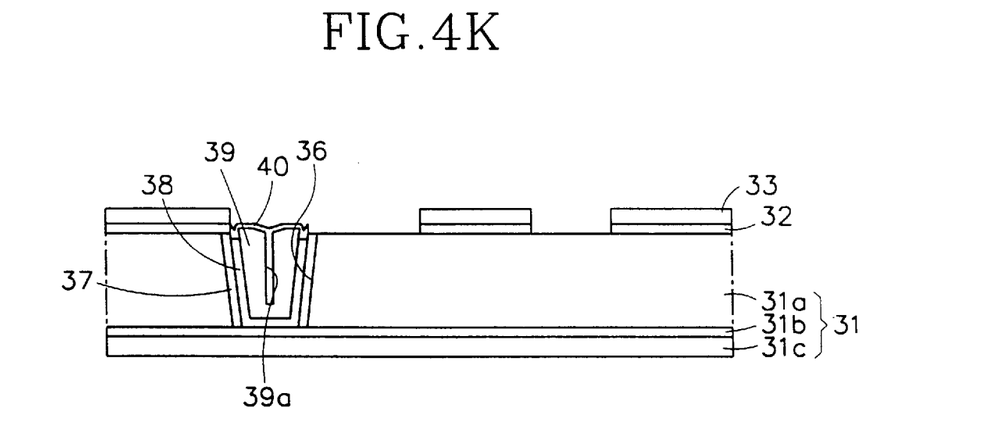

In FIG. 4K, the LOCOS pattern 41 is removed. Thus, the sixth insulating film 40 is thoroughly exposed.

Figure 4L:
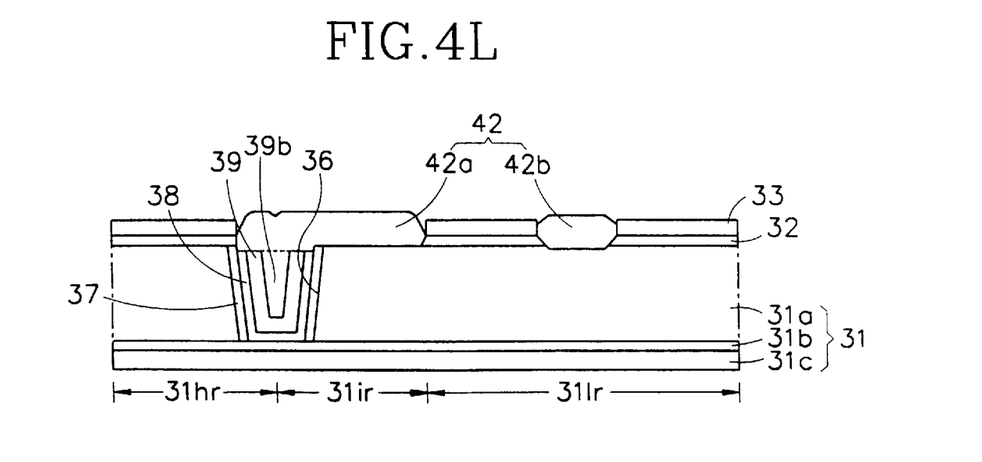

In FIG. 4L, the sixth insulating film 40 positioned on trench 36 and an exposed surface of the SOI substrate 1 are grown at 7000 A according to the thermal oxidation method, thereby forming a field insulating film 42*b* at the LV device region 31*lr*, and a field insulating film 42*a* which connects the interfacing region 31*ir* and the trench region of the HV device region 31*hr*. Here, oxygen is permeated into the empty space (or groove) 39*a* of the trench 36, thus forming a SiO$_2$ film 39*b*, the SiO$_2$ film 39*b* being formed with the field insulating film 42*a* as a single body. Next, the second insulating film 33 is removed and thus the device insulation method in the semiconductor power IC is completed. The field insulating films 42*a* and 42*b* are formed at 1000 A under the oxygen/hydrogen atmosphere.

As described above, the device insulation structure and the device isolation method in the semiconductor power IC according to the present invention has several advantages.

First, the HV device region, the LV device region, and the interfacing region are isolated by the trench method, the LOCOS method, and the LOCOS method, respectively, thus simplifying the manufacturing process.

Second, when forming the field insulating film (e.g., 42) according to the LOCOS method, the thermal oxide film (e.g., 39*b*) is formed by oxygen that is permeated into the empty space in the conductive film (e.g., 39) of the trench, thus improving several aspects of the manufacturing process, such as manufacturing costs, reliability, etc., by restraining breakdown from being generated between HV devices at a high voltage.

Lastly, when a contact hole is subsequently formed on the insulation film for an interconnection process, a surface of the insulating film has uniform step and topology, thus an aspect ratio of each contact hole formed at the HV device region and at the LV device region is improved, and the interconnection has high reliability.

It will be apparent to those skilled in the art that various modifications and variations can be made in the device insulation structure and the device isolation method in the semiconductor power IC of the present invention without departing from the spirit or scope of the invention. Thus, it is intended that the present invention cover the modifications and variations of this invention provided they come within the scope of the appended claims and their equivalents.

What is claimed is:

1. A device isolation structure in a semiconductor power integrated circuit, comprising:

a semiconductor substrate that includes a high voltage device region, a low voltage device region, and an interfacing region positioned between the high voltage device region and the low voltage device region;

a trench overlapping the high voltage device region of the semiconductor substrate and at least a portion of the interfacing;

a first insulating film and a conductive film sequentially layered in the trench, wherein the conductive film has a groove in a center portion of the trench; and a second insulating film positioned in the groove of the conductive film in a center portion of the trench and at least a surface portion of the substrate located over interfacing region, wherein the second insulating film is formed in a direction substantially perpendicular to a surface of the semiconductor substrate.

2. The structure of claim 1, wherein the semiconductor substrate is a silicon on insulator (SOI) substrate.

3. The structure of claim 2, wherein the trench is formed in a silicon layer of the SOI substrate.

4. The structure of claim 1, further comprising:

a third insulating film positioned over a surface portion of the semiconductor substrate.

5. The structure of claim 1, wherein the first insulating film is a silicon oxide film.

6. The structure of claim 1, wherein the conductive film is a polysilicon film.

7. The structure of claim 1, further comprising:

a third insulating film positioned over a surface portion of the semiconductor substrate, wherein each of the second and third insulating films is a thermal oxide film.

8. The structure of claim 7, wherein the second and third insulating films are formed simultaneously.

9. The structure of claim 7, wherein the third insulating film is formed over the low voltage device region of the semiconductor substrate and wherein the second insulating film is a single body that extends above an entire surface portion of the interfacing region.

10. A device isolation structure in a semiconductor power integrated circuit, comprising:

a semiconductor substrate that includes a high voltage device region, a low voltage device region and an interfacing region between the high and low voltage device regions;

a trench overlapping the high voltage device region and the interfacing region of the semiconductor substrate; and an insulating film positioned within the trench and extending above a surface portion of the interfacing region of the semiconductor substrate, wherein the insulating film is a single body that extends above the entire surface portion of the interfacing region of the semiconductor substrate.

11. The device of claim 10, further comprising:

a field insulating film positioned on a surface portion of the low voltage device region, isolated from the insulating film positioned within the trench and extending above the entire surface portion of the interfacing region of the semiconductor substrate.

12. The device of claim 10, further comprising:

a conductive film positioned within the trench, between the insulating film and the semiconductor substrate.

13. The device of claim 12, further comprising:

an insulating film positioned between the conductive film and the semiconductor substrate.

* * * * *